(12) United States Patent
Dudley et al.

(10) Patent No.: US 6,594,797 B1
(45) Date of Patent: Jul. 15, 2003

(54) METHODS AND CIRCUITS FOR PRECISE EDGE PLACEMENT OF TEST SIGNALS

(75) Inventors: Rick W. Dudley, San Jose, CA (US); Jae Cho, Sunnyvale, CA (US); Robert D. Patrie, Scotts Valley, CA (US); Robert W. Wells, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/521,947

(22) Filed: Mar. 9, 2000

(51) Int. Cl.[7] ................................................ G06F 11/00
(52) U.S. Cl. ...................... 714/815; 714/724; 714/799
(58) Field of Search ............................... 714/815, 724, 714/731, 799

(56) References Cited

U.S. PATENT DOCUMENTS 5,854,797 A * 12/1998 Schwartz et al.
6,073,259 A * 6/2000 Sartschev et al.
6,466,520 B1 * 10/2002 Speyer et al. ............... 368/118

FOREIGN PATENT DOCUMENTS

WO          WO 99108125          2/1999

OTHER PUBLICATIONS

Xilinx The Programmable Logic Data Book 1999, available from Xilinx, Inc., 2100 Logic Drive, San Jose, California 95124.

* cited by examiner

Primary Examiner—Phung M. Chung
(74) Attorney, Agent, or Firm—Arthur J. Behiel; Edel M. Young

(57) ABSTRACT

Described are methods and circuits for accurately placing signal transitions, or "edges," simultaneously on two or more pins of an integrated circuit (IC). A conventional tester is connected to an integrated circuit, such as a programmable logic device. The integrated circuit is adapted to include a coincidence detector that compares the timing of edges on two input pins of the integrated circuit. The coincidence detector indicates when the two edges are coincident, allowing an operator of the tester to adjust the tester to establish coincidence. The amount of offset necessary to provide coincident edges is stored in a database for later use in deskewing edges used in subsequent tests. The integrated circuit can be a programmable logic device configured to include one or more coincidence detectors with which to place edges relative to one another on different pins.

20 Claims, 3 Drawing Sheets

METHODS AND CIRCUITS FOR PRECISE EDGE PLACEMENT OF TEST SIGNALS

FIELD OF THE INVENTION

This invention relates generally to automatic test equipment for integrated circuits, and in particular to methods and circuits for precisely placing signal transitions for use in testing integrated circuits.

BACKGROUND

Most semiconductor devices are tested at least once using some form of automated test equipment (generally, a "tester"). Modern semiconductor chips have many pins and, to fully test the semiconductor device, the tester must generate and measure signals for all of these pins simultaneously.

Testers generally have a "per-pin" architecture in which separate "channels" within the tester generate or measure one signal corresponding to a single input or output pin on a device under test. Each channel is separately controlled to generate or measure a different signal. A pattern generator, the function of which is to send commands to each channel to generate or measure one test signal for each of many test periods, controls the various channels. Each channel generally contains at least one edge generator programmed to generate a signal transition, or "edge," at a certain time relative to the start of each test period.

Testers must place accurately timed edges at the various pins of a device under test to make accurate pin-to-pin measurements. When properly calibrated, testers with hundreds or even thousands of channels are only able to reduce the relative error between channels to somewhere in the range of ±150 ps to ±1 ns. All measurements require at least two edges be placed, so the cumulative measurement error inherent in the tester can contribute somewhere between 300 ps and 2 ns of uncertainty. Unfortunately, this inherent tester error often exceeds the value of the parameter being measured. There is therefore a need for a means of more precisely placing edges on the pins of devices under test.

SUMMARY

The present invention provides an accurate means of placing signal transitions, or "edges," simultaneously on two or more pins of an integrated circuit (IC). The inventive circuit is particularly useful for testing programmable logic devices, which can be programmed to include one or more coincidence detectors with which to place edges relative to one another on different pins.

In accordance with an embodiment of the invention, a conventional tester is connected to an integrated circuit, such as a programmable logic device. The integrated circuit is adapted to include a coincidence detector that compares the timing of edges on two input pins of the integrated circuit. The coincidence detector indicates when the two edges are coincident, allowing an operator of the tester to adjust the tester to achieve coincidence. The amount of offset necessary to provide coincident edges is then stored in a database for later use in deskewing edges for test.

In some embodiments, the integrated circuit is provided with a number of coincidence detectors that collectively determine the timing offsets necessary to adjust the tester to create coincident signals on every input pin of the integrated circuit.

In those embodiments in which the integrated circuit is a programmable logic device, the resources used to instantiate the one or more coincidence detectors can be used to instantiate other components once the test configuration is calibrated.

DETAILED DESCRIPTION

Figure 1:
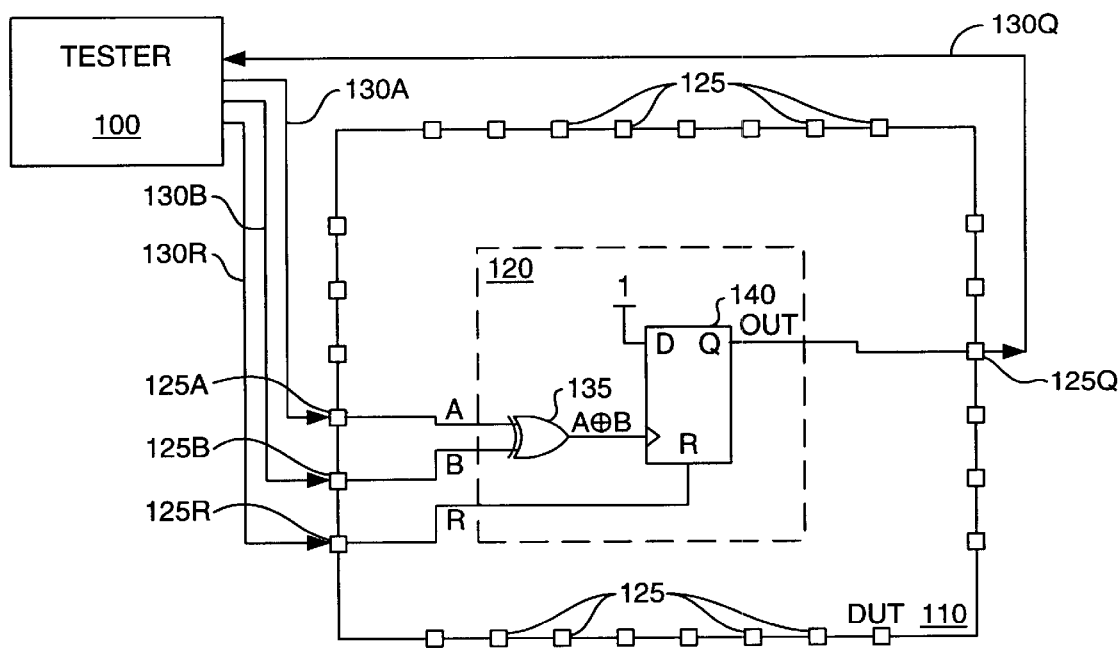
FIG. 1 depicts a conventional tester 100 connected to a device under test (DUT) 110 adapted in accordance with the invention.

FIG. 1 depicts a conventional tester 100 connected to a device under test (DUT) 110. In the example, DUT 110 is a field-programmable gate array (FPGA). In accordance with the invention, DUT 110 includes a coincidence detector 120 that can be used to calibrate tester 100 to produce coincident edges on device input pins 125A and 125B, two of the many pins 125 on DUT 110.

Coincidence detector 120 includes-input terminals A, B, and R and an output terminal OUT connected to respective tester leads 130A, 130B, 130R, and 130Q through respective device pins. Coincidence detector 120 further includes an XOR gate 135 and a flip-flop 140. Tester 100 initializes coincidence detector 120 by presenting a positive pulse on lead 130R, thus resetting flip-flop 140.

In one embodiment, DUT 110 is a Virtex™ FPGA available from Xilinx, Inc., of San Jose, Calif. Virtex™ FPGAs include configurable logic blocks that can be configured to instantiate coincidence detector 120. For more information about Virtex and other types of FPGAs for use with the invention, see "The Programmable Logic Data Book," (1999) from Xilinx, Inc., which is incorporated herein by reference.

Figure 2A:
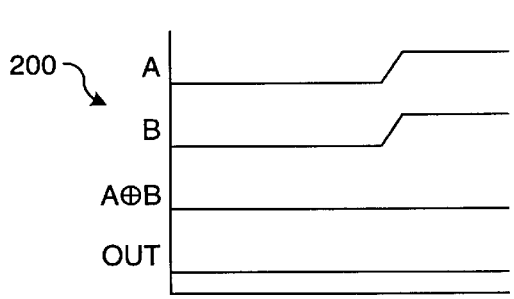
FIG. 2A is a waveform diagram 200 illustrating the case in which simultaneous edges of the same polarity are presented on each of pins 125A and 125B.

FIG. 2A is a waveform diagram 200 illustrating the case in which simultaneous edges of the same polarity are presented on each of pins 125A and 125B. As is conventional, XOR gate 135 outputs a logic one if the signals on input terminals A and B have opposite logic levels (i.e., A=1 and B=0 or A=0 and B=1). Because each of signals A and B transition at the same instant, the logic levels on terminals A and B remain the same. The output of XOR gate 135 therefore remains a logic zero. Output terminal OUT also remains at logic zero in the absence of a positive-going edge to clock the flip-flop.

Figure 2B:
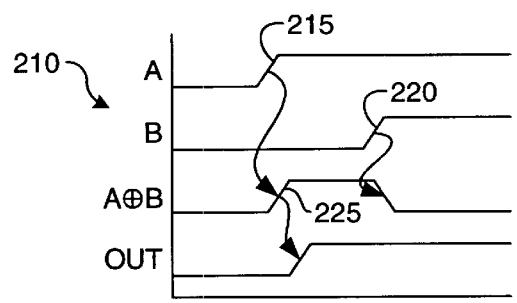
FIG. 2B is a waveform diagram 210 illustrating an edge (i.e., signal transition) 215 on terminal A arriving before an edge 220 on terminal B.

FIG. 2B is a waveform diagram 210 illustrating an edge (i.e., signal transition) 215 on terminal A arriving before an edge 220 on terminal B. XOR gate 135 will output a logic one during the time separating edges 215 and 220 when the signals on terminals A and B are at opposite logic levels. The positive-going edge 225 on the output of XOR gate 135 will clock flip-flop 140, causing flip-flop 140 to store the logic one on data terminal D and to output the stored level on output terminal OUT. The logic one on output terminal OUT indicates that edges 215 and 220 are not coincident.

Figure 2C:
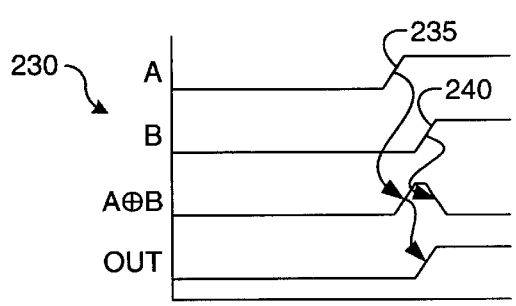
FIG. 2C is a waveform diagram 230 illustrating an edge 235 on terminal A arriving before an edge 240 on terminal B.

FIG. 2C is a waveform diagram 230 illustrating an edge 235 on terminal A arriving before an edge 240 on terminal B. The edges are closer than in FIG. 2B, so XOR gate 135 outputs a logic one for a shorter period. The short pulse is still sufficient to clock flip-flop 140, so flip-flop 140 outputs a logic one, indicating that edges 235 and 240 are not coincident.

Figure 2D:
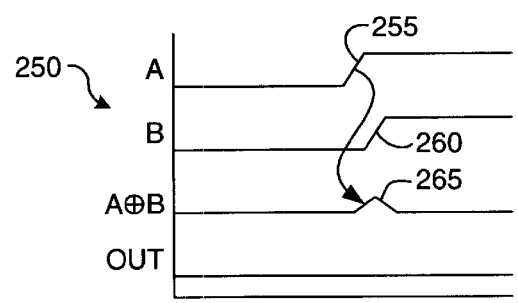
FIG. 2D is a waveform diagram 250 illustrating an edge 255 on terminal A arriving only slightly before an edge 260 on terminal B.

FIG. 2D is a waveform diagram 250 illustrating an edge 255 on terminal A arriving only slightly before an edge 260 on terminal B. The signal transitions are spaced far enough apart so that XOR gate 135 exhibits a small voltage spike 265. However, the small spike is insufficient to clock flip-flop 140, and therefore does not affect a change on line OUT. Thus, coincidence detector 120 will indicate coincident signals although edges 255 and 250 are not exactly coincident. The maximum delay between edges for which coincidence detector 120 indicates coincidence determines the resolution of coincidence detector 120, and may vary considerably depending upon the selected type of coincidence detector.

The resolution limits of coincidence detector 120 produce a range of edge spacing for which coincidence detector 120 will fail to identify the edges as not coincident. A method in accordance with the invention determines this range and uses this information to estimate the actual skew between the edges presented on the input pins in question.

Figure 3:
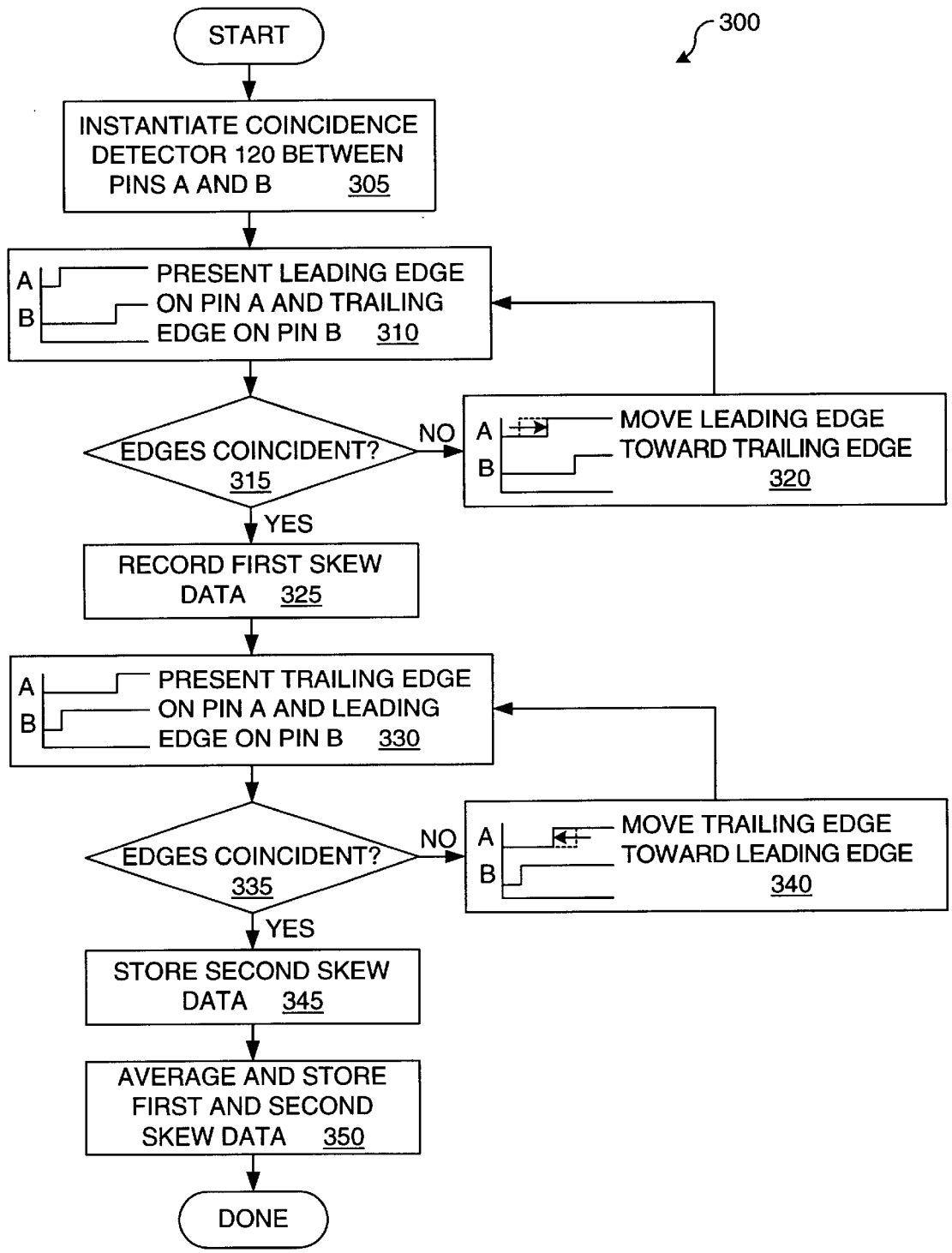
FIG. 3 is a flowchart 300 illustrating a method for estimating the skew between pins A and B of FIG. 1.

FIG. 3 is a flowchart 300 illustrating a method for estimating the skew between pins A and B of FIG. 1. First coincidence detector 120 is instantiated on DUT 110 (step 305). In an embodiment in which DUT 110 is an FPGA, coincidence detector 120 can be created from configurable logic using conventional FPGA programming techniques. Alternatively, coincidence detector 120 can be dedicated circuitry on programmable or non-programmable devices. Whether hard-wired or created using programmable logic, the signal paths between coincidence detector 120 and external pins 125A and 125B should have well-matched delays so that they do not contribute to a lack of coincidence. Alternatively, the signal paths can be mismatched but accurately characterized so that any delays they contribute can be accounted for.

Tester 100 places edges on each of pins 125A and 125B (step 310). These edges are spaced sufficiently in time to ensure that coincidence detector 120 indicates that the signals are not coincident. In the example of FIG. 3, the edge on pin 125A leads the edge on pin 125B. Then, using the following sequence of steps, the spacing between the two edges is reduced incrementally until coincidence detector 120 indicates that the edges are coincident.

Assuming the edges are sufficiently not coincident for coincidence detector 120 to output a logic one (decision 315), the channel in tester 100 corresponding to pin A is adjusted to move the leading edge on pin 125A toward the trailing edge on pin 125B (step 320). Adjusting the delay associated with a given channel is well within the skill of those familiar with operating testers. Coincidence detector 120 is then reset and the process returns to step 310 in which the new pair of edges, now more closely spaced, are presented on pins 125A and 125B.

By cycling through steps 310, 315, and 320, the delay separating the edges on A and B is incrementally reduced until coincidence detector 120 indicates that the two edges are coincident (in decision 315). The relative timing of the two edges (i.e., the first skew data) is then recorded, for example in memory within tester 100 (step 325).

Next, tester 100 again places edges on each of pins 125A and 125B (step 330). This time, however, the edge on pin 125A is set to trail the edge on pin 125B by an amount sufficient to ensure that coincidence detector 120 indicates that the signals are not coincident. Then, using the following sequence of steps, the spacing between the two edges is reduced incrementally until coincidence detector 120 again indicates that the edges are coincident.

Assuming the edges are sufficiently not coincident for coincidence detector 120 to output a logic one (decision 335), the channel in tester 100 corresponding to pin A is adjusted to move the trailing edge on pin 125A toward the leading edge on pin 125B (step 340). Coincidence detector 120 is then reset and the process returns to step 330 in which the new pair of edges, now more closely spaced, are presented on pins 125A and 125B.

By cycling through steps 330, 335, and 340, the delay separating the edges on A and B is again incrementally reduced until coincidence detector 120 indicates that the two edges are coincident (in decision 335). The relative timing of the two edges (i.e., the second skew data) is then recorded in local memory within tester 100 (step 345).

In an illustrative example, the transition on pin 125B is held to a delay of 150 ps with respect to some reference as the transition on pin 125A is swept upward from 0 ps, in minimum increments equal to the tester resolution, for example 10 ps, from the same reference (larger increments can be used to approach coincidence). Coincidence detector 120 first indicates coincidence when the delay imposed on the edge on pin 125A is 240 ps from the reference. Next, the edge on pin 125B is held to a delay of 150 ps as the transition on pin 125A is swept downward from 1 ns. This time, coincidence detector 120 indicates coincidence when the delay imposed on the edge on pin 125A is 320 ps from the reference. From the exemplary data, one can assume that the edges would be exactly coincident if tester 100 is set to provide the edge on pin 125A between 240 and 320 ps from the reference, or, subtracting the 150 ps delay associated with the edge on pin 125B, between 90 and 170 ps from the edge on pin 125B.

As a first approximation, the edges are deemed coincident at the midpoint (i.e., the average) of the 240 and 320 ps extremes, or at 280 ps from the reference. One can therefore conclude that imposing a delay of 130 ps (i.e., 280 ps–150 ps) on pin 125A and zero delay on pin 125B will produce simultaneous transitions on pins 125A and 125B. The 130 ps average skew is then stored in memory in tester 100 (step 350).

To ensure the accuracy of skew data acquired using the above process, the measurements can be repeated in reverse order (i.e., beginning with the trailing edge on pin A), and/or sweeping the edge on pin B relative to pin A. The results of these tests can then be averaged.

Having discovered that the true skew between pins 125A and 125B is 130 ps, tester 100 can be set to delay edges on pin 125A by 130 ps relative to edges on pins 125B to provide coincident edges on respective pins 125A and 125B. And, once the skew is known for pins 125A and 125B in a particular test configuration, this knowledge can be used to precisely measure the performance of other circuits within DUT 110 that receive input signals on pins 125A and 125B.

Skew data similar to that obtained above for pins 125A and 125B is useful for each pin 125 on DUT 110. The present invention is therefore extended, in one embodiment, to obtain precise skew data for every pin relative to every other pin.

Figure 4A:
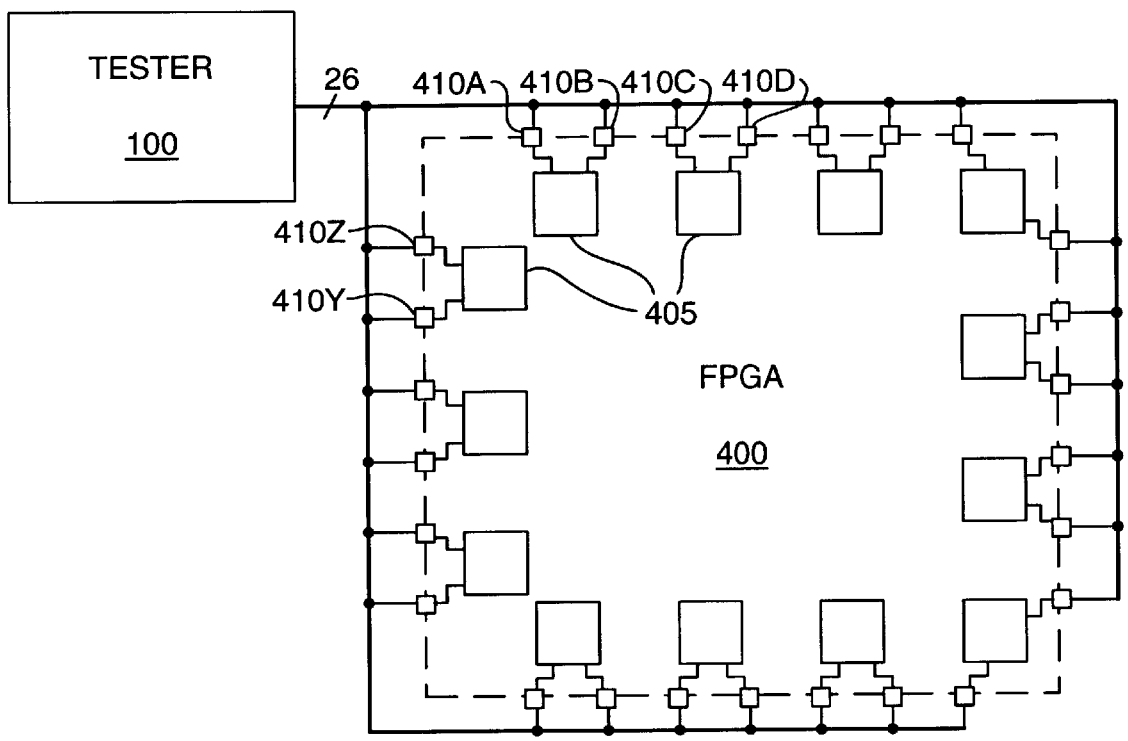
FIG. 4A is a block diagram depicting an FPGA 400 configured to include a plurality of coincidence detectors 405 in accordance with the invention.

FIG. 4A is a block diagram depicting an FPGA 400 configured to include a plurality of coincidence detectors 405 in accordance with the invention. Each coincidence detector 405 is similar to coincidence detector 120 of FIG. 1. A single coincidence detector 405 is adapted to measure the coincidence of signals on a pair of input pins. For example, the top, left-most instance of coincidence detector 405 connects to each of two pins 410A and 410B, analogous to pins 125A and 125B of FIG. 1. The reset and output terminals of coincidence detector 120 are present in coincidence detectors 405, but have been omitted from FIG. 4A for clarity.

FPGA 400 includes 26 input/output pins 410A through 410Z. Beginning with pins 410A and 410B, an instance of coincidence detector 405 determines the skew between those pins in the manner described above in connection with FIGS. 1 and 3. The remaining instances of coincidence detector 410 compare other pairs of pins. The set of skew data thus obtained, labeled "Skew 4A" in the following Table 1, is then stored, for example in local memory of tester 100.

TABLE 1

| PIN | SKEW 4A | SKEW 4B | PIN | SKEW 4A | SKEW 4B |
|---|---|---|---|---|---|
| 410A | 90 | | 410N | | 330 |
| 410B | | -150 | 410O | 290 | |
| 410C | -150 | | 410P | | -60 |
| 410D | | 0 | 410Q | 250 | |
| 410E | -90 | | 410R | | 120 |
| 410F | | -210 | 410S | -210 | |
| 410G | 210 | | 410T | | 150 |
| 410H | | 120 | 410U | -30 | |
| 410I | -300 | | 410V | | -600 |
| 410J | | 150 | 410W | 140 | |
| 410K | 330 | | 410X | | 180 |
| 410L | | -360 | 410Y | -60 | |
| 410M | 130 | | 410Z | | -270 |
| 410N | | | 410A | | |

The columns labeled "Skew 4A" in Table 1 provide exemplary skew data, in picoseconds, for each pair of pins. For example, "simultaneous" edges placed by tester 100 on pins 410A and 410B are actually spaced by 90 picoseconds, arriving first at pin 410A.

The skew data of column "Skew 4A" describes the relative timing of each measured pair of pins, but does not describe the relative timing of pins connected to different instances of coincidence detector 405. For example, the skew of pin 410A with respect to pin 410C cannot be obtained using the data of column "Skew 4A." FPGA 400 is therefore reconfigured, in one embodiment, to include additional coincidence detectors to provide additional skew data.

Figure 4B:
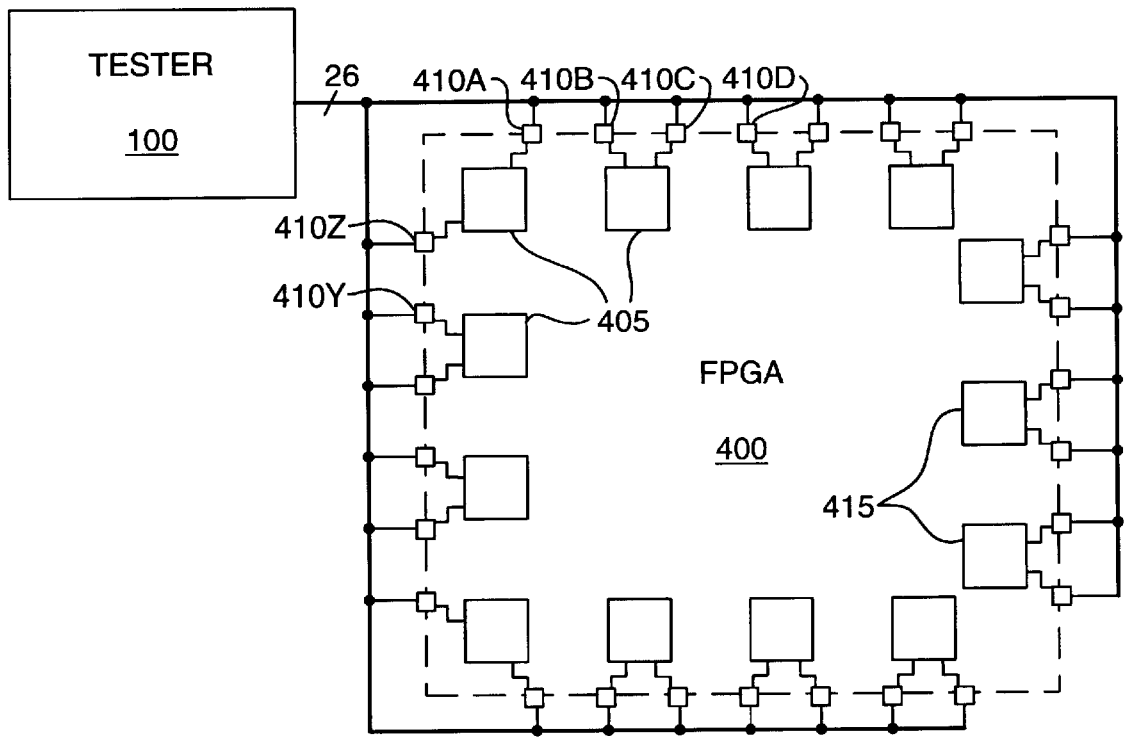
FIG. 4B is a block diagram depicting FPGA 400 of FIG. 4A.

FIG. 4B is a block diagram depicting FPGA 400 of FIG. 4A. As in FIG. 4A, FPGA 400 is configured to include an instance of coincidence detector 405 for each pair of pins. In contrast to FIG. 4A, however, the pairs of pins compared by the coincidence detectors of FIG. 4B are shifted by one pin. Additional skew data can thus be obtained for pairs of pins that were not compared in the configuration of FIG. 4A. This second set of skew data, labeled "Skew 4B" in Table 1, is then stored with the data "Skew 4A" from FIG. 4A.

The combined skew data from the configurations of FIGS. 4A and 4B provides all the information needed to determine the skew of any one pin relative to any other. For example, the skew between pins 410A and 410D is the sum of the skews between 410A and 410B, 410B and 410C, and 410C and 410D.

Once all of the requisite skew data is available, a single pin is selected as a reference and the skew data of the remaining pins is normalized with respect to that reference. Table 2 shows the skew data of Table 1

TABLE 2

| PIN | DLY | PIN | DLY | PIN | DLY | PIN | PIN |
|---|---|---|---|---|---|---|---|
| 410A | 0 | 410H | -300 | 410O | 100 | 410V | 610 |
| 410B | 90 | 410I | -180 | 410P | 390 | 410W | 10 |
| 410C | -60 | 410J | -480 | 410Q | 330 | 410X | 150 |
| 410D | -210 | 410K | -330 | 410R | 580 | 410Y | 330 |
| 410E | -210 | 410L | 0 | 410S | 700 | 410Z | 270 |
| 410F | -300 | 410M | -360 | 410T | 490 | | |
| 410G | -510 | 410N | -230 | 410U | 640 | | | normalized such that pin 410A represents a delay of zero. The remaining pins are assigned offset values, in picoseconds. This collection of normalized skew data in Table 2 can then be stored and the offsets employed to establish coincident signals during subsequent test procedures. That is, each channel of tester 100 is preset to provide the delays in Table 2 for the device pin associated with the selected channel. Thus configured, tester 100 would provide very nearly coincident edges on each pin.

The example of FIGS. 4A and 4B are illustrative; in practice, the process of measuring the skew of each pair of pins in an FPGA may take more than two configurations because some resources (e.g., pins) would be used for the reset and output signals discussed in connection with FIG. 1. Other embodiments may require only a single pattern, as where coincidence detectors are provided between every two pins between which skew is to be measured. In such a configuration, output signals could be stored in on-chip memory to be read later by tester 100.

While the present invention has been described in connection with specific embodiments, variations of these embodiments will be obvious to those of ordinary skill in the art. For example, for higher accuracy, the digital comparators can be replaced by special purpose high bandwidth analog waveform comparators. For another example, tester driver channels deskewed by this method may be connected to their corresponding comparator channel allowing deskew of the comparator strobes.

Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A system comprising:
   a. a circuit tester having first and second tester output leads and a tester input lead;
   b. an integrated circuit including:
      i. a first circuit input pin connected to the first tester output lead;
      ii. a second circuit input pin connected to the second tester output lead; and iii. a coincidence detector having a first detector input node connected to the first circuit input pin, a second detector input node connected to the second circuit input pin, and a detector output node.

2. The system of claim 1, wherein the integrated circuit includes a circuit output pin connected to the tester input lead.

3. The system of claim 1, wherein the detector output node connects to the circuit output pin.

4. The system of claim 1, wherein the integrated circuit is a programmable logic device.

5. The system of claim 1, wherein the integrated circuit further comprises:
   a. third and fourth circuit input pins; and
   b. a second coincidence detector having first and second detector input nodes connected to the respective third and fourth input pins.

6. The system of claim 1, wherein the circuit tester is adapted to position a first signal transition on the first tester output lead and to position a second signal transition on the second tester output lead, and wherein the coincidence detector determines whether the first and second signal transitions arrive at the first and second detector input nodes simultaneously.

7. The system of claim 1, wherein the coincidence detector includes a sequential logic element having an output terminal connected to the detector output node.

8. The system of claim 7, wherein the coincidence detector further includes an exclusive OR gate having an output terminal connected to a clock terminal of the sequential logic element.

9. The system of claim 8, wherein the exclusive OR gate includes first and second input terminals connected to respective ones of the first and second circuit input pins.

10. The system of claim 7, wherein the sequential logic element is a flip-flop.

11. The method of claim 10, wherein adjusting the delay period comprises reducing the delay period.

12. The method of claim 10, further comprising, after adjusting the delay period,
   a. generating a third signal transition on the first test lead and a fourth signal transition on the second test lead, the third signal transition separated from the fourth signal transition by a second delay period different from the first-mentioned delay period; and
   b. if the third and fourth signal transitions are not coincident, adjusting the second delay period.

13. The method of claim 10, wherein instantiating a coincidence detector comprises configuring a programmable logic device to include the coincidence detector.

14. A method of synchronizing signal transitions on first and second test leads of a circuit tester, the method comprising:
   a. instantiating a coincidence detector on an integrated circuit, the coincidence detector having first and second detector input terminals and an output terminal;
   b. connecting the first and second detector input terminals to respective ones of the first and second test leads;
   c. generating a first signal transition on the first test lead and a second signal transition on the second test lead, the first signal transition separated from the second signal transition by a delay period;
   d. monitoring the output terminal of the coincidence detector to determine whether the first and second signal transitions are coincident; and
   e. if the first and second signal transitions are not coincident, adjusting the delay period.

15. A system comprising:
   a. a circuit tester having:
      i. a first test channel providing a first test signal on a first tester output lead; and
      ii. a second test channel providing a second test signal on a second tester output lead;
   b. a device under test (DUT) including:
      i. a first DUT input pin connected to the first tester output lead and receiving the first test signal;
      ii. a second DUT input pin connected to the second tester output lead and receiving the second test signal; and
      iii. a coincidence detector having a first detector input node receiving the first test signal, a second detector input node receiving the second test signal, and a detector output node.

16. The system of claim 15, wherein the circuit tester further includes a tester input lead, and wherein the DUT includes a DUT output pin connected to the tester input lead.

17. The system of claim 15, wherein the DUT is a programmable logic device configured to include the coincidence detector.

18. The system of claim 15, wherein the DUT further comprises:
   a. third and fourth DUT input pins; and
   b. a second coincidence detector having first and second detector input nodes connected to the respective third and fourth DUT input pins.

19. The system of claim 15, wherein the first test signal includes a first signal transition on the first tester output lead and the second test signal includes a second signal transition on the second tester output lead, and wherein the coincidence detector determines whether the first and second signal transitions arrive at the first and second detector input nodes simultaneously.

20. The system of claim 15, wherein the coincidence detector includes a sequential logic element having a sequential-logic-element output terminal connected to the detector output node.

* * * * *